(12) United States Patent
Choi et al.

(10) Patent No.: US 10,424,761 B2
(45) Date of Patent: Sep. 24, 2019

(54) ELECTROLUMINESCENT DISPLAY DEVICE

(71) Applicant: LG Display Co., Ltd., Seoul (KR)

(72) Inventors: Yong-Hoon Choi, Paju-si (KR); Won-Hoe Koo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/142,511

(22) Filed: Sep. 26, 2018

(65) Prior Publication Data

US 2019/0097177 A1     Mar. 28, 2019

(30) Foreign Application Priority Data

Sep. 27, 2017  (KR) .................. 10-2017-0124973

(51) Int. Cl.
| | | |
|---|---|---|
| H01L 27/32 | (2006.01) | |
| H01L 51/52 | (2006.01) | |
| H01L 31/0236 | (2006.01) | |

(52) U.S. Cl.
CPC ...... H01L 51/5275 (2013.01); H01L 27/3225 (2013.01); H01L 27/3244 (2013.01); H01L 31/02366 (2013.01); H01L 51/5209 (2013.01); H01L 51/5225 (2013.01)

(58) Field of Classification Search
CPC ....................................................... H01L 27/30
See application file for complete search history.

(56) References Cited

U.S. PATENT DOCUMENTS

| | | |
|---|---|---|
| 2006/0125388 A1 | 6/2006 | Song et al. |
| 2017/0084676 A1 | 3/2017 | Jang et al. |
| 2017/0092705 A1 | 3/2017 | Lim et al. |

OTHER PUBLICATIONS

Rauscher et al., "Wetting Phenomena in Nanofluidics", Annual Review of Materials Research 2008. 38:143-172. Downloaded from www.annualreviews.org (article doi: 10.1146/annurev.matsci.38. 060407.132451).

Extended European Search Report issued in European Application No. 18194578.3 dated Nov. 20, 2018.

*Primary Examiner* — Cheung Lee
(74) *Attorney, Agent, or Firm* — Morgan, Lewis & Bockius LLP

(57) ABSTRACT

An electroluminescent display device includes a substrate including an emissive area and a non-emissive area, a plurality of protrusions over the substrate and in the emissive area, each of the plurality of protrusions spaced apart from each other with an air gap therebetween, a high-viscosity material layer on the plurality of protrusions and the air gaps, a first electrode on the high-viscosity material layer, an emitting layer on the first electrode, and a second electrode on the emitting layer.

20 Claims, 11 Drawing Sheets

| h | d1 | θ₁ | d2 | amount of extracted light(%) | A/R | d1/d2 |
|---|---|---|---|---|---|---|
| 2.5um | 1um | 78.7° | 1.5um | 44 | 5.00 | 0.67 |
| 2.5um | 2um | 78.7° | 1.5um | 50 | 2.50 | 1.33 |
| 2.5um | 3um | 78.7° | 1.5um | 50 | 1.67 | 2.00 |
| 2.5um | 4um | 78.7° | 1.5um | 50 | 1.25 | 2.67 |
| 2.5um | 5um | 78.7° | 1.5um | 45 | 1.00 | 3.33 |
| 2.5um | 6um | 78.7° | 1.5um | 42 | 0.83 | 4.00 |

ELECTROLUMINESCENT DISPLAY DEVICE

CROSS-REFERENCE TO RELATED APPLICATIONS

This application claims priority to and the benefit of Republic of Korea Patent Application No. 2017-0124973 filed in the Republic of Korea on Sep. 27, 2017, which is incorporated herein by reference in its entirety.

BACKGROUND

1. Technical Field

The present disclosure relates to an electroluminescent display device, and more particularly, to an electroluminescent display device capable of improving light extraction efficiency.

2. Discussion of the Related Art

Flat panel displays have been widely developed and applied to various fields. Among the flat panel displays, an electroluminescent display device may be a device in which a charge is injected into an emission layer formed between a cathode, which is an electron-injecting electrode, and an anode, which is a hole-injecting electrode, such that excitons are formed by electrons and holes. Radiative recombination of the excitons occurs such that light is emitted.

Such an electroluminescent display device has advantages in that not only is it able to be formed even on a flexible substrate, such as plastic, but it also has a large contrast ratio due to being a self-emitting type, is able to easily realize a dynamic image due to having a response time of about several microseconds (μs), has no limit in terms of viewing angle, is stable even at a low temperature, and is able to be driven at a relatively low voltage of DC 5 V to 15 V such that it is easy to manufacture and design a drive circuit.

FIG. 1 is a cross-sectional view of an electroluminescent display device according to the related art.

As illustrated in FIG. 1, an electroluminescent display device 1 includes a substrate 10, a thin film transistor Tr disposed on the substrate 10, a light emitting diode D disposed over the substrate 10 and connected to the thin film transistor Tr and a color filter pattern 50 under the light emitting diode D. An encapsulation layer (not shown) may be disposed over the light emitting diode D.

The light emitting diode D includes a first electrode 41, an emission layer 42, and a second electrode 43, wherein light from the emitting layer 42 is output to the outside through the first electrode 41.

The light emitted from the emitting layer 42 passes through various configurations of the electroluminescent display device 1 and exits the electroluminescent display device 1.

However, a surface plasmon component generated at a boundary between a metal and the emitting layer 42 and an optical waveguide mode, which is configured by the emitting layer 42 inserted into reflective layers at both sides, accounts for about 60 to 70% of emitted light.

Accordingly, among light emitted from the emitting layer 42, rays of light that are trapped in the electroluminescent display device 1, instead of exiting the electroluminescent display device 1, are present. Thus, there is a problem in that light extraction efficiency (out-coupling efficiency) of the electroluminescent display device 1 is degraded.

SUMMARY

Accordingly, the present disclosure is directed to an electroluminescent display that substantially obviates one or more of the problems due to limitations and disadvantages of the related art.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims hereof as well as the appended drawings.

To achieve these and other advantages and in accordance with the purpose of the present disclosure, as embodied and broadly described, an electroluminescent display device includes a substrate including an emissive area and a non-emissive area, a plurality of protrusions over the substrate and in the emissive area, each of the plurality of protrusions spaced apart from each other with an air gap therebetween, a high-viscosity material layer on the plurality of protrusions and the air gaps, a first electrode on the high-viscosity material layer, an emitting layer on the first electrode, and a second electrode on the emitting layer.

It is to be understood that both the foregoing general description and the following detailed description are examples and are explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Hereinafter, example embodiments of the present disclosure will be described with reference to the accompanying drawings.

Figure 1:
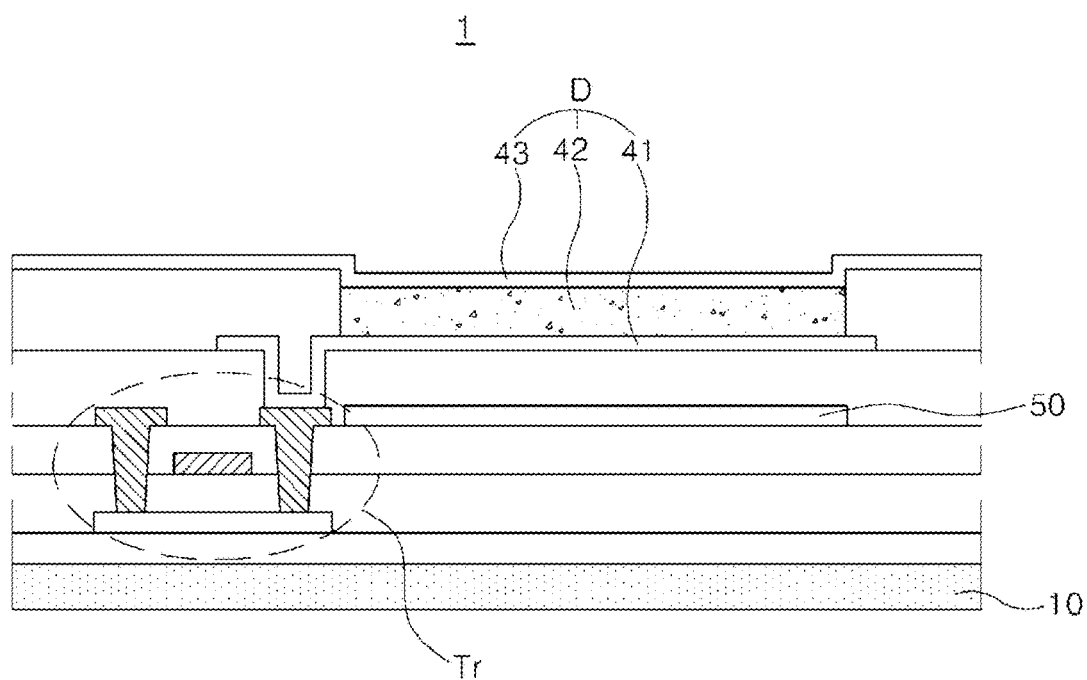
FIG. 1 is a cross-sectional view illustrating an electroluminescent display device according to the related art.
Figure 2:
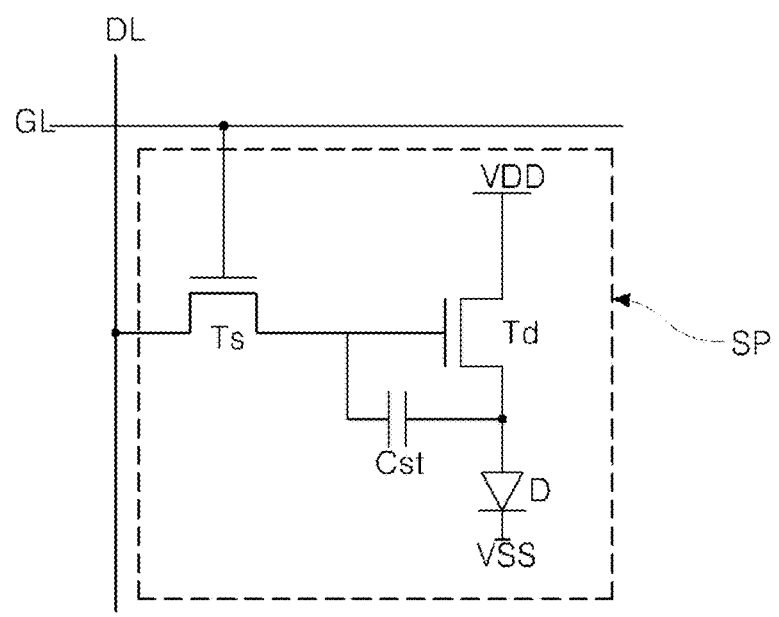
FIG. 2 is a circuit diagram illustrating a single subpixel area of an electroluminescent display device according to an example embodiment of the present disclosure.

FIG. 2 is a circuit diagram illustrating a single subpixel area of an electroluminescent display device according to an embodiment of the present disclosure.

As illustrated in FIG. 2, the electroluminescent display device according to an embodiment of the present disclosure includes a gate line GL and a data line DL, which intersect with each other and define a subpixel area SP. A switching thin film transistor Ts, a driving thin film transistor Td, a storage capacitor Cst, and a light emitting diode D are formed in each subpixel area SP.

In an example, a gate electrode of the switching thin film transistor Ts is connected to the gate line GL, and a source electrode is connected to the data line DL. A gate electrode of the driving thin film transistor Td is connected to a drain electrode of the switching thin film transistor Ts, and a drain electrode is connected to a high-potential voltage VDD. An anode of the light emitting diode D is connected to a source electrode of the driving thin film transistor Td, and a cathode is connected to a low-potential voltage VSS. The storage capacitor Cst is connected to the gate electrode and the source electrode of the driving thin film transistor Td.

In an image display operation of such an electroluminescent display device, the switching thin film transistor Ts is turned on in accordance with a gate signal applied through the gate line GL, and in this case, a data signal applied to the data line DL is applied to the gate electrode of the driving thin film transistor Td and one electrode of the storage capacitor Cst through the switching thin film transistor Ts.

The driving thin film transistor Td is turned on in accordance with the data signal and controls a current which flows in the light emitting diode D to display an image. The light emitting diode D emits light due to a current of the high-potential voltage VDD transmitted through the driving thin film transistor Td.

That is, because an amount of current which flows in the light emitting diode D is proportional to an amplitude of the data signal, and an intensity of light emitted by the light emitting diode D is proportional to the amount of current flowing in the light emitting diode D, the subpixel area SP displays a grayscale, which differs in accordance with the amplitude of the data signal, and as a result, the electroluminescent display device displays an image.

The storage capacitor Cst serves to maintain a charge which corresponds to the data signal during one frame in order to make an amount of current flowing in the light emitting diode D constant and maintain a grayscale, which the light emitting diode D displays, to be constant.

A transistor and/or a capacitor other than the switching and driving thin film transistors Ts and Td and the storage capacitor Cst may be further added in the subpixel area SP.

First Example Embodiment

Figure 3:
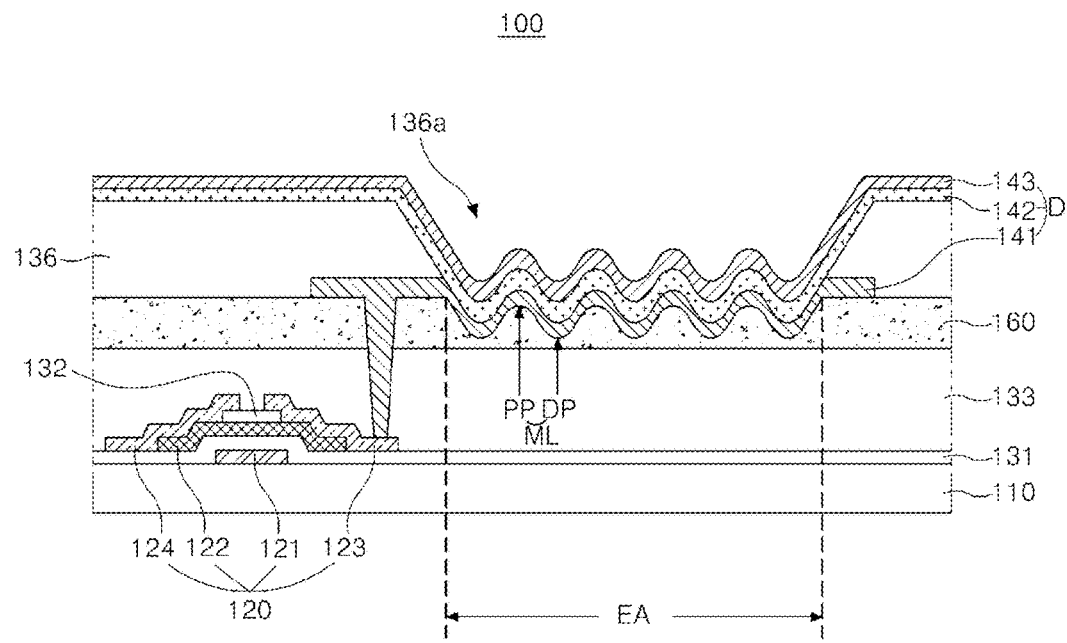
FIG. 3 is a cross-sectional view illustrating an electroluminescent display device according to a first example embodiment of the present disclosure.
Figure 4:
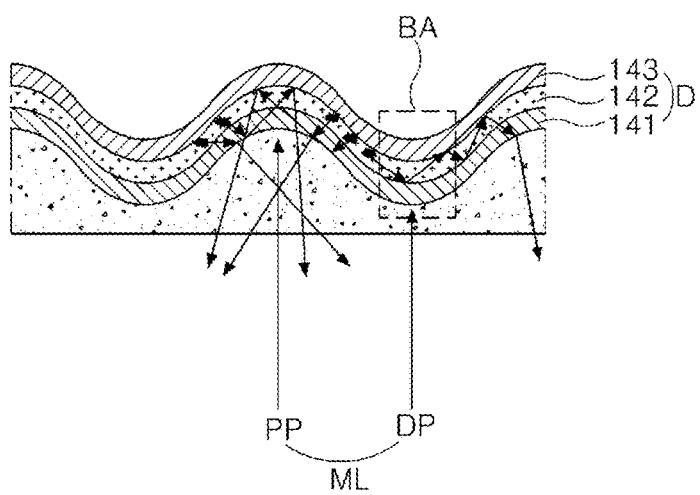
FIG. 4 is an enlarged view illustrating an overcoat layer and a light emitting diode of the electroluminescent display device according to the first example embodiment of the present disclosure.

FIG. 3 is a cross-sectional view illustrating an electroluminescent display device according to a first example embodiment of the present disclosure, and FIG. 4 is an enlarged view illustrating an overcoat layer and a light emitting diode of the electroluminescent display device according to the first example embodiment of the present disclosure.

As illustrated in FIG. 3, an electroluminescent display device 100 according to a first example embodiment of the present disclosure includes a substrate 110, a thin film transistor 120, an overcoat layer 160, and a light emitting diode D electrically connected to the thin film transistor 120.

The electroluminescent display device 100 according to the first example embodiment of the present disclosure is illustrated as being a bottom emission type, in which light from an emitting layer 142 is output to the outside through a first electrode 141, but embodiments are not limited thereto. That is, the electroluminescent display device 100 according to the first example embodiment of the present disclosure may also be a top emission type, in which light from the emitting layer 142 is output to the outside through a second electrode 143.

When the electroluminescent display device 100 is the top emission type, a reflective electrode or a reflective layer may be further formed below the first electrode 141. For example, the reflective electrode or the reflective layer may be formed of an aluminum-palladium-copper (APC) alloy. In this case, the second electrode 143 may have a relatively small thickness for light to transmit therethrough.

The electroluminescent display device 100 according to the first example embodiment of the present disclosure may include, on the substrate 110, a thin film transistor 120 which includes a gate electrode 121, an active layer 122, a source electrode 123, and a drain electrode 124. In an example, the gate electrode 121 of the thin film transistor 120 and a gate insulating film 131 may be disposed on the substrate 110.

The active layer 122 which overlaps the gate electrode 121 may be disposed on the gate insulating film 131. An etch stopper 132 for protecting a channel area of the active layer 122 may be disposed on the active layer 122. The source electrode 123 and the drain electrode 124, which come into contact with the active layer 122, may be disposed on the active layer 122.

The electroluminescent display device to which embodiments of the present disclosure are applicable is not limited to that illustrated in FIG. 3. In one example, the electroluminescent display device 100 may further include a buffer layer disposed between the substrate 110 and the active layer 122, and the etch stopper 132 may not be disposed thereon.

For convenience of description, only the driving thin film transistor has been illustrated from among various thin film transistors that may be included in the electroluminescent display device 100. Although the thin film transistors 120 will be described as having an inverted staggered structure or bottom gate structure in which, with respect to the active layer 122, the gate electrode 121 is disposed opposite the source electrode 123 and the drain electrode 124, this is merely an example, and a thin film transistor which has a coplanar structure or top gate structure in which, with respect to the active layer 122, the gate electrode 121 is disposed to be collinear with the source electrode 123 and the drain electrode 124, may also be used.

A protective layer 133 may be disposed on the drain electrode 124 and the source electrode 123. In this case, although the protective layer 133 is illustrated as smoothing an upper portion of the thin film transistor 120, the protective layer 133 may also be disposed along the shapes of surfaces of configurations located below the protective layer 133 instead of smoothing the upper portion of the thin film transistor 120.

The overcoat layer 160 may be disposed on the protective layer 133. The protective layer 133 may be omitted. That is, the overcoat layer 160 may be disposed on the thin film transistor 120.

A color filter pattern (not shown) may be disposed between the protective layer 133 and the overcoat layer 160. The color filter pattern is configured to change a color of light emitted from the emitting layer 142, and may be one of a red color filter pattern, a green color filter pattern, and a blue color filter pattern. The color filter pattern may be disposed at positions which correspond to an emissive area EA on the protective layer 133, and may only be disposed in portions of the emissive area EA.

Emissive area EA refers to an area in which the emitting layer 142 emits light due to the first electrode 141 and the second electrode 143, and the color filter pattern being disposed at a position corresponding to the emissive area EA means that the color filter pattern is disposed to prevent a blurring phenomenon and a ghost phenomenon which occur due to mixing of light emitted from adjacent emissive areas EA.

A pixel of the present disclosure may include one or more subpixels. For example, a single pixel may include two to four subpixels. A subpixel may refer to a unit in which a specific type of color filter pattern is formed, or in which the light emitting diode D is capable of emitting a particular color without the color filter pattern. Colors defined in a subpixel may include red (R), green (G), blue (B), and optionally white (W), but embodiments are not limited thereto.

To improve the light extraction efficiency in the electroluminescent display device 100 according to the first example embodiment of the present disclosure, the electroluminescent display device 100 may include a micro lens ML disposed in the overcoat layer 160 which corresponds to the emissive area EA.

The micro lens ML may include a plurality of recessed portions DP and a plurality of protruding portions PP, but embodiments are not limited thereto. The micro lens ML may have various other forms.

In an area in which the plurality of recessed portions DP and the plurality of protruding portions PP are not disposed, the overcoat layer 160 serves as a smoothing layer. Each of the plurality of recessed portions DP may have various shapes in plan view, such as a hexagonal shape, a semicircular shape, a semielliptical shape, and a quadrilateral shape.

The light emitting diode D including the first electrode 141, the emitting layer 142, and the second electrode 143 may be disposed on the overcoat layer 160.

To block the spread of outgassing from the overcoat layer 160 to the light emitting diode D, a second protective layer (not shown) which has an insulating property may be disposed between the overcoat layer 160 and the first electrode 141.

That is, the second protective layer, which follows the morphology of the plurality of recessed portions DP and the plurality of protruding portions PP of the overcoat layer 160 exactly, may be disposed between the overcoat layer 160 and the first electrode 141.

The first electrode 141 may be disposed on the overcoat layer 160. In this case, the first electrode 141 may be an anode or cathode for supplying one of electrons or holes to the emitting layer 142.

A case in which the first electrode 141 of the electroluminescent display device 100 according to the first example embodiment of the present disclosure is an anode will be described as an example.

The first electrode 141 may be formed of a conductive material whose work function value is relatively large. For example, the first electrode 141 may be formed of a transparent conductive material such as indium-tin-oxide (ITO) and indium-zinc-oxide (IZO).

The first electrode 141 may be connected to the source electrode 123 of the thin film transistor 120 through a contact hole formed in the overcoat layer 160, and may be separately formed for each pixel area.

The electroluminescent display device according to the first example embodiment of the present disclosure has been described using an example which assumes that the thin film transistor 120 is an N-type thin film transistor in which the first electrode 141 is connected to the source electrode 123, but embodiments are not limited thereto. When the thin film transistor 120 is a P-type thin film transistor, the first electrode 141 may also be connected to the drain electrode 124.

The first electrode 141 may also be electrically connected to the emitting layer 142 by coming into contact with the emitting layer 142 with a conductive material therebetween. The first electrode 141 is disposed in a shape which follows the morphology of a surface of the overcoat layer 160. That is, the first electrode 141 may be disposed in a form which follows the morphology of the plurality of recessed portions DP and the plurality of protruding portions PP of the overcoat layer 160 exactly.

A bank layer 136 may be disposed on the overcoat layer 160 and the first electrode 141. The bank layer 136 may include an opening 136a configured to expose the first electrode 141. The bank layer 136 may be disposed between adjacent pixel (or subpixel) areas and serve to differentiate the adjacent pixel (or subpixel) areas. In this case, the plurality of recessed portions DP and the plurality of protruding portions PP of the overcoat layer 160 may be disposed in the opening 136a of the bank layer 136.

That is, the plurality of recessed portions DP and the plurality of protruding portions PP of the overcoat layer 160 may be disposed to overlap the color filter pattern, which is disposed below the plurality of recessed portions DP and the plurality of protruding portions PP, and overlap the opening 136a of the bank layer 136, which is disposed above the plurality of recessed portions DP and the plurality of protruding portions PP.

The emitting layer 142 may be disposed on the exposed first electrode 141. The emitting layer 142 may have a tandem white structure in which a plurality of emitting layers are stacked to emit white light.

For example, the emitting layer 142 may include a first emitting layer configured to emit blue light and a second emitting layer disposed on the first emitting layer and configured to emit light having a color which turns white when mixed with blue.

The second emitting layer may be an emitting layer configured to emit yellow-green light.

The emitting layer 142 may only include emitting layers that emit one of blue light, red light, and green light. In this case, the electroluminescent display device may not include the color filter pattern.

In this case, an emitting material of the emitting layer 142 may be an organic emitting material, or an inorganic emitting material such as a quantum dot.

Also, the emitting layer 142 may have a shape which follows the morphology of the overcoat layer 160.

The second electrode 143 for supplying one of electrons or holes to the emitting layer 142 may be disposed on the emitting layer 142. In this case, the second electrode 143 may be an anode or a cathode.

A case in which the second electrode 143 of the electroluminescent display device 100 according to the first example embodiment of the present disclosure is a cathode will be described as an example.

The second electrode 143 may be formed of a conductive material, whose work function value is relatively small, which is located on a front surface of a display area. For example, the second electrode 143 may be formed of aluminum (Al), magnesium (Mg), silver (Ag), or an alloy thereof, but embodiments are not limited thereto.

The second electrode 143 may have a shape which follows the morphology of the overcoat layer 160.

The first electrode 141, the emitting layer 142, and the second electrode 143 form the light emitting diode D, and the light emitting diode D follows the morphology of the plurality of recessed portions DP and the plurality of protruding portions PP of the overcoat layer 160. The shape of the light emitting diode D may be realized using the plurality of recessed portions DP and the plurality of protruding portions PP of the overcoat layer 160.

As illustrated in FIG. 4, light output from the emitting layer 142 is reflected, refracted, and output to the outside through the protruding portions PP of the overcoat layer 160 and the first electrode 141 in the electroluminescent display device 100 according to the first example embodiment of the present disclosure. However, in areas BA in which the recessed portions DP of the overcoat layer 160 are formed, light output from the emitting layer 142 travels by being totally reflected inside the emitting layer 142 without being output to the outside.

Figure 5:
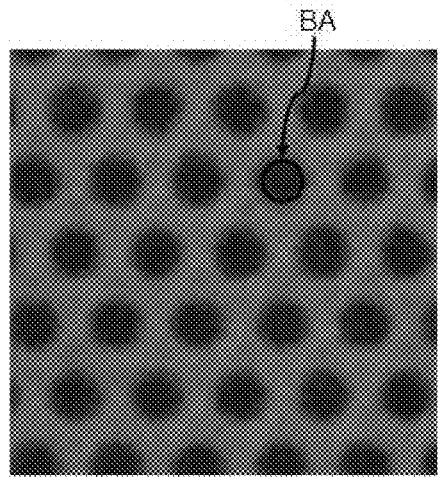
FIG. 5 is a picture in which a black area is observed from a recessed portion area of the electroluminescent display device according to the first example embodiment of the present disclosure.

FIG. 5 is a picture in which a black area is observed from a recessed portion area of the electroluminescent display device according to the first example embodiment of the present disclosure.

As illustrated in FIG. 5, there is a problem in that the areas BA, in which the recessed portions DP are formed, of the electroluminescent display device 100 (see FIG. 3) according to the first example embodiment of the present disclosure are observed as black areas, because light is unable to be output to the outside therefrom. Such a problem is a factor that causes degradation of image quality of the electroluminescent display device 100 (see FIG. 3).

As described above, although light extraction efficiency can be improved through the protruding portions PP of the micro lens ML in the electroluminescent display device 100 according to the first example embodiment of the present disclosure, there is a problem in that areas BA in which the recessed portions DP are formed are observed as black areas.

Hereinafter, description will be given, according to second and third example embodiments, on an electroluminescent display device capable of preventing a problem in which a black area is generated while improving light extraction efficiency.

Second Example Embodiment

Hereinafter, detailed description of configurations identical or similar to those of the first example embodiment may be omitted.

Figure 6:
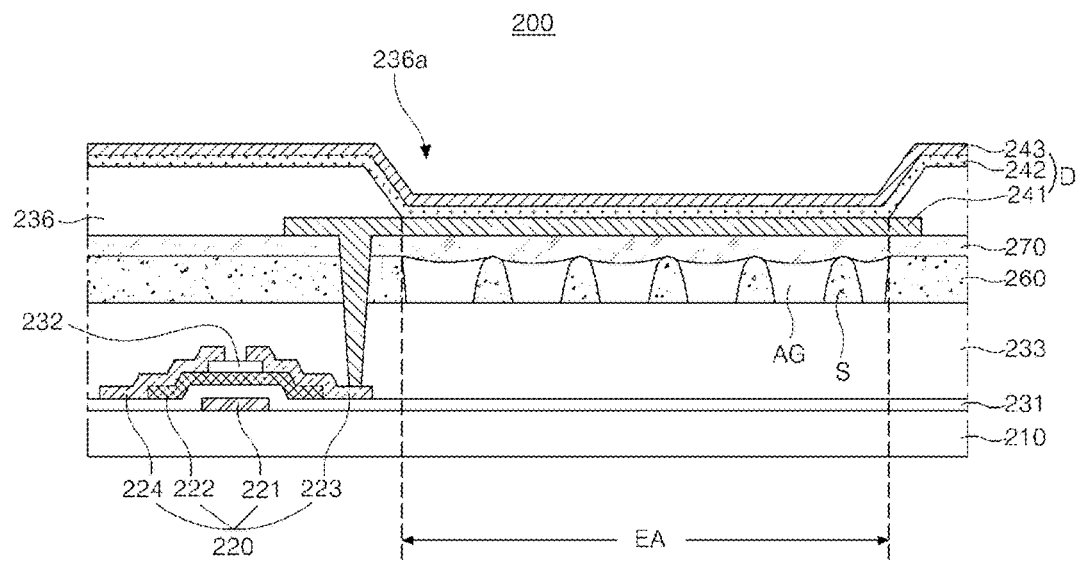
FIG. 6 is a cross-sectional view illustrating an electroluminescent display device according to a second example embodiment of the present disclosure.
Figure 7:
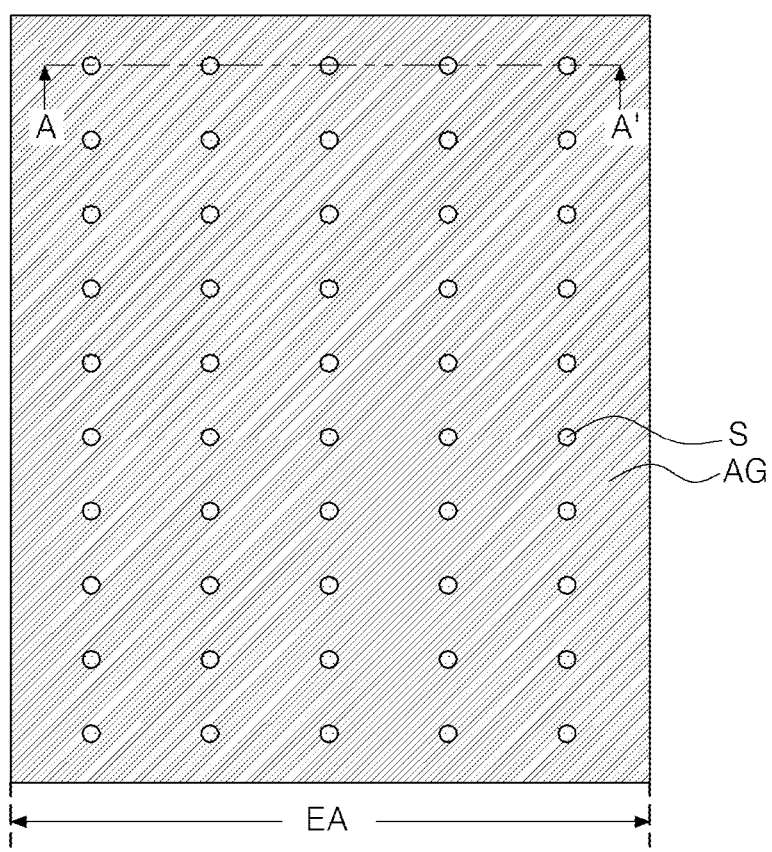
FIG. 7 is a plan view illustrating an emissive area of the electroluminescent display device according to the second example embodiment of the present disclosure.
Figure 8:
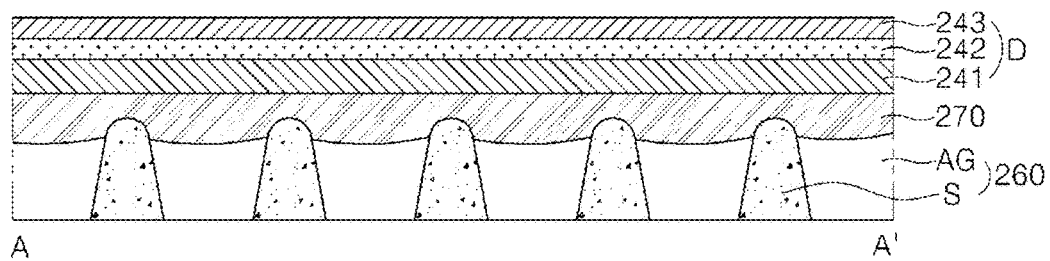
FIG. 8 is a cross-sectional view taken along line A-A' of FIG. 7.

FIG. 6 is a cross-sectional view illustrating an electroluminescent display device according to a second example embodiment of the present disclosure, FIG. 7 is a plan view illustrating an emissive area of the electroluminescent display device according to the second example embodiment of the present disclosure, and FIG. 8 is a cross-sectional view taken along line A-A' of FIG. 7.

As illustrated in FIG. 6, an electroluminescent display device 200 according to the second example embodiment of the present disclosure includes a substrate 210, a thin film transistor 220, an overcoat layer 260, and a light emitting diode D electrically connected to the thin film transistor 220.

The electroluminescent display device 200 according to the second example embodiment of the present disclosure is illustrated as being a bottom emission type in which light from an emitting layer 242 is output to the outside through a first electrode 241, but embodiments are not limited thereto.

That is, the electroluminescent display device 200 according to the second example embodiment of the present disclosure may also be a top emission type in which light from the emitting layer 242 is output to the outside through a second electrode 243.

When the electroluminescent display device 200 is the top emission type, a reflective electrode or a reflective layer may be further formed below the first electrode 241. For example, the reflective electrode or the reflective layer may be formed of an APC alloy. In this case, the second electrode 243 may have a relatively small thickness for light to transmit therethrough.

The electroluminescent display device 200 according to the second example embodiment of the present disclosure may include, on the substrate 210, a thin film transistor 220 which includes a gate electrode 221, an active layer 222, a source electrode 223, and a drain electrode 224.

In an example, the gate electrode 221 of the thin film transistor 220 and a gate insulating film 231 may be disposed on the substrate 210.

The active layer 222, which overlaps the gate electrode 221, may be disposed on the gate insulating film 231. An etch stopper 232 for protecting a channel area of the active layer 222 may be disposed on the active layer 222. The source electrode 223 and the drain electrode 224, which come into contact with the active layer 222, may be disposed on the active layer 222.

The electroluminescent display device 200 to which the second example embodiment of the present disclosure is applicable is not limited to that illustrated in FIG. 6. In an example, the electroluminescent display device 200 may further include a buffer layer disposed between the substrate 210 and the active layer 222, and the etch stopper 232 may not be disposed thereon.

For convenience of description, only the driving thin film transistor has been illustrated from among various thin film transistors that may be included in the electroluminescent display device 200. Although the thin film transistors 220 will be described as having an inverted staggered structure or bottom gate structure in which, with respect to the active layer 222, the gate electrode 221 is disposed opposite the source electrode 223 and the drain electrode 224, this is merely an example, and a thin film transistor, which has a coplanar structure or top gate structure in which, with respect to the active layer 222, the gate electrode 221 is disposed to be collinear with the source electrode 223 and the drain electrode 224, may also be used.

A protective layer 233 may be disposed on the drain electrode 224 and the source electrode 223. In this case, although the protective layer 233 is illustrated as smoothing an upper portion of the thin film transistor 220, the protective layer 233 may also be disposed along the shapes of surfaces of configurations located below the protective layer 233 instead of smoothing the upper portion of the thin film transistor 220.

The overcoat layer 260 may be disposed on the protective layer 233. The protective layer 233 may be omitted. That is, the overcoat layer 260 may be disposed on the thin film transistor 220.

The overcoat layer 260 of the electroluminescent display device 200 according to the second example embodiment of the present disclosure may include a plurality of protrusions S, each of which are disposed in the form of an island, and air gaps AG in the emissive area EA. For example, the plurality of protrusions S, each of which are spaced apart from each other, is disposed on the protective layer 233 such that the air gaps AG are generated between adjacent protrusions S.

That is, in the emissive area EA, portions of the overcoat layer 260 except for the plurality of protrusions S may be etched through a process such as photolithography, wet etching, and dry etching.

Accordingly, in the emissive area EA, the plurality of protrusions S, each of which are disposed in the form of an island, may be formed in the overcoat layer 260.

In an area in which the plurality of protrusions S and air gaps AG are not disposed, the overcoat layer 260 serves as a smoothing layer.

A high-viscosity material layer 270 may be disposed on the overcoat layer 260. In this case, the air gaps AG may be formed between the plurality of protrusions S of the overcoat layer 260 due to the high-viscosity material layer 270 being disposed on the plurality of protrusions S.

The top of the plurality of protrusions S may be covered by the high-viscosity material layer 270, and the high-viscosity material layer 270 may have a protruding shape in a direction in which the substrate 210 is disposed, for areas in which the air gaps AG are formed. However, embodiments are not limited thereto, and the high-viscosity material layer 270 may also have a smooth shape. Due to the high-viscosity characteristic, the air gaps AG are not filled with the high-viscosity material 270.

Refractive indices of the high-viscosity material layer 270 and the plurality of protrusions S may be greater than a refractive index of the air gaps AG. For example, the refractive indices of the high-viscosity material layer 270 and the plurality of protrusions S may be in a range of 1.4 to 1.6, while the refractive index of the air gaps AG is 1.

Refractive indices of the emitting layer 242 and the first electrode 241 may be greater than the refractive indices of the high-viscosity material layer 270 and the plurality of protrusions S. For example, the refractive indices of the emitting layer 242 and the first electrode 241 may be in a range of 1.8 to 2.0.

Accordingly, light output from the emitting layer 242 passes through the first electrode 241, the high-viscosity material layer 270 having a relatively low refractive index, the air gaps AG having a relatively low refractive index, and the plurality of protrusions S having a relatively high refractive index, thereby being output to the outside instead of being trapped inside the emitting layer 242.

That is, because the plurality of protrusions S and air gaps AG guide light, which is trapped without being output to the outside, and allow the light to be extracted, light extraction efficiency may be improved.

The plurality of protrusions S and air gaps AG will be described in more detail below.

A color filter pattern (not shown) may be disposed between the overcoat layer 260 and the protective layer 233 in the emissive area EA. That is, the color filter pattern may be disposed between the protective layer 233 and the plurality of protrusions S and air gaps AG.

The color filter pattern is configured to change a color of light emitted from the emitting layer 242, and may be one of a red color filter pattern, a green color filter pattern, and a blue color filter pattern.

The color filter pattern may be disposed at positions which correspond to the emissive area EA on the protective layer 233, and may only be disposed in portions of the emissive area EA.

Emissive area EA may refer to an area in which the emitting layer 242 emits light due to the first electrode 241 and the second electrode 243, and the color filter pattern being disposed at a position corresponding to the emissive area EA may mean that the color filter pattern is disposed to prevent a blurring phenomenon and a ghost phenomenon which occur due to mixing of light emitted from adjacent emissive areas EA.

For example, the color filter pattern may be disposed to overlap the emissive area EA and, for example, have a size less than or equal to that of the emissive area EA.

However, the arrangement position and size of the color filter pattern may be determined by various factors such as a distance between the color filter pattern and the first electrode 241, a distance between the color filter pattern and the overcoat layer 260, and a distance between the emissive area EA and a non-emissive area, as well as the size and position of the emissive area EA.

A pixel of the present disclosure may include one or more subpixels. For example, a single pixel may include two to four subpixels. A subpixel may refer to a unit in which a specific type of color filter pattern is formed, or in which the light emitting diode D is capable of emitting a particular color without the color filter pattern.

Colors defined in a subpixel may include red (R), green (G), blue (B), and optionally white (W), but embodiments are not limited thereto.

The light emitting diode D which includes the first electrode 241, the emitting layer 242, and the second electrode 243 may be disposed on the high-viscosity material layer 270.

The first electrode 241, the emitting layer 242, and the second electrode 243 of the electroluminescent display device 200 according to the second example embodiment of the present disclosure may be formed to be smooth in the emissive area EA. In this case, the first electrode 241 may be an anode or cathode for supplying one of electrons or holes to the emitting layer 242.

A case in which the first electrode 241 of the electroluminescent display device 200 according to the second example embodiment of the present disclosure is an anode will be described as an example.

The first electrode 241 may include an amorphous metal oxide. For example, the amorphous metal oxide may include, for example, any one selected from the group consisting of indium zinc oxide (IZO), zinc tin oxide (ZTO), tin oxide ($SnO_2$), zinc oxide (ZnO), indium oxide ($In_2O_3$), gallium indium tin oxide (GITO), indium gallium zinc oxide (IGZO), zinc indium tin oxide (ZITO), indium gallium oxide (IGO), gallium oxide ($Ga_2O_3$), aluminum zinc oxide (AZO), and gallium zinc oxide (GZO).

The first electrode 241 may be connected to the source electrode 223 of the thin film transistor 220 through a contact hole formed in the overcoat layer 260 and the high-viscosity material layer 270, and may be separately formed in each pixel area.

Although the electroluminescent display device 200 according to the second example embodiment of the present disclosure has been described using an example which assumes that the thin film transistor 220 is an N-type thin film transistor in which the first electrode 241 is connected to the source electrode 223, embodiments are not limited thereto. When the thin film transistor 220 is a P-type thin film transistor, the first electrode 241 may also be connected to the drain electrode 224.

The first electrode 241 may also be electrically connected to the emitting layer 242 by coming into contact with the emitting layer 242 with a conductive material therebetween.

A bank layer 236 may be disposed on the high-viscosity material layer 270 and the first electrode 241. The bank layer 236 may include an opening 236a configured to expose the first electrode 241. The bank layer 236 may be disposed between adjacent pixel (or subpixel) areas and serve to differentiate the adjacent pixel (or subpixel) areas.

The bank layer 236 may be formed of a photo acrylic organic material, but embodiments are not limited thereto.

The emitting layer 242 may be disposed on the first electrode 241 and the bank layer 236. The emitting layer 242 may have a tandem white structure in which a plurality of emitting layers are stacked to emit white light. For example, the emitting layer 242 may include a first emitting layer configured to emit blue light and a second emitting layer disposed on the first emitting layer and configured to emit light having a color which turns white when mixed with blue.

The second emitting layer may be an emitting layer configured to emit yellow-green light.

The emitting layer 242 may only include emitting layers that emit one of blue light, red light, and green light. In this case, the electroluminescent display device 200 may not include a color filter pattern.

In this case, an emitting material of the emitting layer 242 may be an organic emitting material or an inorganic emitting material such as a quantum dot.

Also, the emitting layer 242 may be disposed along the shape of the first electrode 241 in the emissive area EA. That is, the emitting layer 242 may be disposed to be smooth along the shape of the first electrode 241 in the emissive area EA.

The second electrode 243 for supplying one of electrons or holes to the emitting layer 242 may be disposed on the emitting layer 242. In this case, the second electrode 243 may be an anode or a cathode.

A case in which the second electrode 243 of the electroluminescent display device 200 according to the second example embodiment of the present disclosure is a cathode will be described as an example.

The second electrode 243 may be formed of a conductive material, whose work function value is relatively small, and which is located on a front surface of a display area. For example, the second electrode 243 may be formed of Al, Mg, Ag, or an alloy thereof, but embodiments are not limited thereto.

The second electrode 243 may be disposed to be smooth along the shape of the emitting layer 242 in the emissive area EA.

The first electrode 241, the emitting layer 242, and the second electrode 243 form the light emitting diode D.

As illustrated in FIG. 7, the overcoat layer 260 of the electroluminescent display device 200 according to the second example embodiment of the present disclosure may include the plurality of protrusions S, each of which are disposed in the form of an island, in the emissive area EA.

Each of the plurality of protrusions S may have a circular shape in plan view, but embodiments are not limited thereto. Each of the plurality of protrusions S may have various other shapes in plan view, such as a semicircular shape, a semielliptical shape, and a polygonal shape.

In the emissive area EA, the air gaps AG may be formed in areas excluding those in which the plurality of protrusions S are formed. So, the air gaps AG surround the protrusions S in the emissive area EA.

That is, the air gaps AG may be formed in all areas excluding those in which the plurality of protrusions S are formed in the emissive area EA, but embodiments are not limited thereto. The air gaps AG may only be formed in portions of the areas excluding those in which the plurality of protrusions S are formed in the emissive area EA.

As illustrated in FIG. 8, the top of each of the plurality of protrusions S of the electroluminescent display device 200 according to the second example embodiment of the present disclosure may be disposed inside the high-viscosity material layer 270.

That is, as the high-viscosity material layer 270 is disposed on the plurality of protrusions S, the high-viscosity material layer 270 may cover the top of the plurality of protrusions S.

A bottom surface of the high-viscosity material layer 270 may have a protruding shape toward the substrate 210, but embodiments are not limited thereto. The bottom surface of the high-viscosity material layer 270 may also have a smooth shape. In a case in which the bottom surface of the high-viscosity material layer 270 is formed with a protruding shape, light output from the emitting layer 242 may be further diffused.

The bottom surface of the high-viscosity material layer 270 may be formed in various shapes by adjusting the viscosity of the high-viscosity material layer 270, a distance between the plurality of protrusions S, and the like.

By disposing the high-viscosity material layer 270 on the plurality of protrusions S as described above, the air gaps AG having a relatively low refractive index may be formed without a separate process.

Figure 9A:
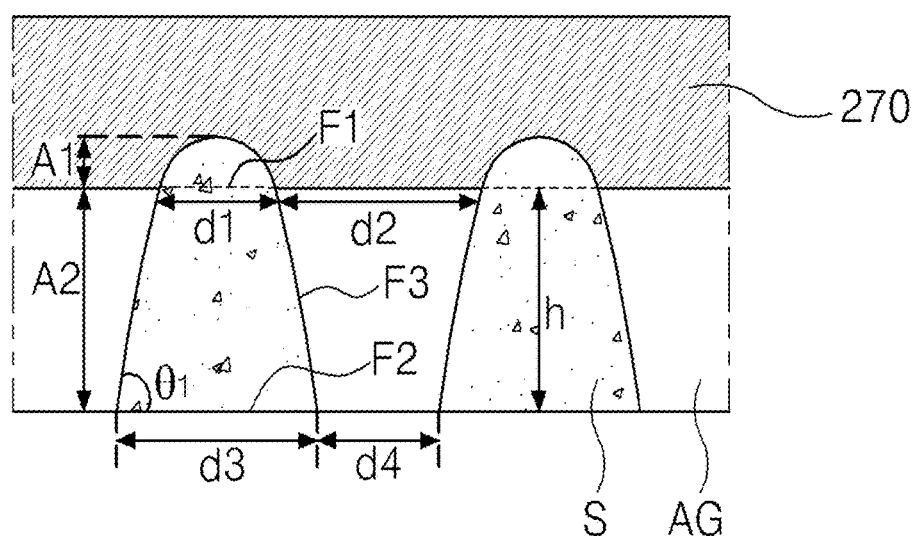
FIG. 9A is an enlarged cross-sectional view of protrusions in the electroluminescent display device according to the second example embodiment of the present disclosure.
Figures 9B, 9C:
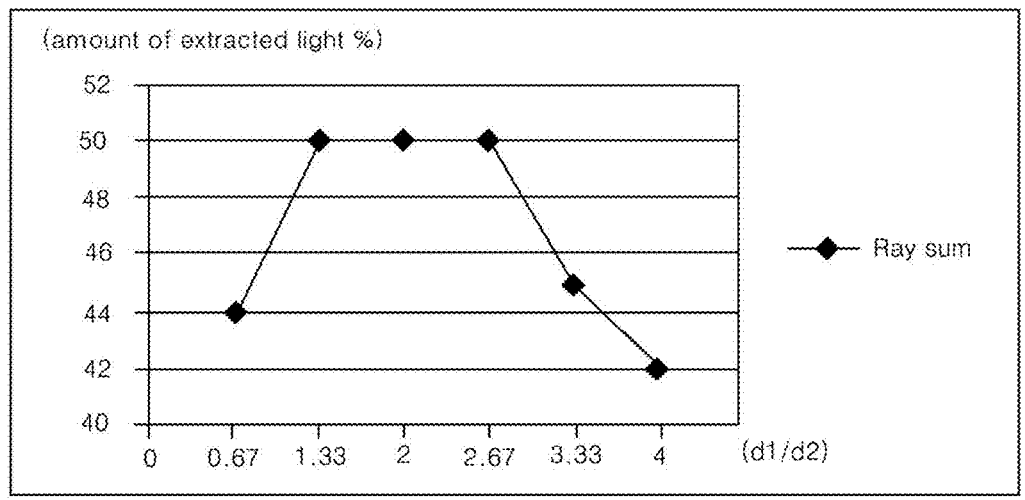
FIG. 9B is a graph illustrating an amount of extracted light in accordance with a ratio of d1/d2 of FIG. 9A.
FIG. 9C is a table illustrating an amount of extracted light in accordance with the ratio of d1/d2 of FIG. 9A.

FIG. 9A is an enlarged cross-sectional view of protrusions in the electroluminescent display device according to the second example embodiment of the present disclosure, FIG. 9B is a graph illustrating an amount of extracted light in accordance with a ratio of d1/d2 of FIG. 9A, and FIG. 9C is a table illustrating an amount of extracted light in accordance with the ratio of d1/d2 of FIG. 9A.

As illustrated in FIG. 9A, each of the plurality of protrusions S of the electroluminescent display device 200 (see FIG. 6) according to the second example embodiment of the present disclosure may include a first portion A1 disposed inside the high-viscosity material layer 270 and a second portion A2 coming into contact with the air gaps AG. Namely, the first portion A1 of the protrusion S is surrounded and covered by the high-viscosity material layer 270. In this case, the high-viscosity material layer 270 may have a first thickness in correspondence to the protrusion S and a second thickness, which is greater than the first thickness, between adjacent protrusions S.

That is, each of the plurality of protrusions S may be divided into the first portion A1, which is inserted into the high-viscosity material layer 270, and the second portion A2, which is an area excluding the first portion A1.

Each of the plurality of protrusions S may include a first surface F1 which is a boundary surface between the first portion A1 and the second portion A2, a second surface F2 which is disposed opposite the first surface F1 and comes into contact with the protective layer 233 (see FIG. 6), and a third surface F3 configured to connect the first surface F1 and the second surface F2.

Also, each of the plurality of protrusions S may have a first length d1 which is a length of the first surface F1 (a diameter of the first surface F1 when the first surface has a circular shape), a second length d2 which is a distance between first surfaces F1 of neighboring protrusions S, a third length d3 which is a length of the second surface F2, and a fourth length d4 which is a distance between second surfaces F2 of neighboring protrusions S.

The second length d2 is illustrated as being greater than the first length d1 in FIG. 9A, but embodiments are not limited thereto. The first length d1 may be greater than the second length d2. The first length d1 may be in a range of 1 μm to 6 μm, and the second length d2 may be in a range of 0.5 μm to 4 μm, but embodiments are not limited thereto. When the first length d1 is formed to be greater than the second length d2, the ratio of the first length d1 to the second length d2 may be in a range of about 1.1 to 2.9.

For example, in the boundary plane between the first portion A1 and the second portion A2, a width (e.g., diameter) of the protrusion S may be greater than a length of the high-viscosity material layer 270 between adjacent protrusions S. In the boundary plane between the first portion A1 and the second portion A2, the ratio of the width of the protrusions S to the length of the high-viscosity material layer 270 between adjacent protrusions S may be in a range of about 1.1 to 2.9.

The second surface F2 and the third surface F3 may form an acute angle θ1 therebetween. That is, an area of the first surface F1 may be less than that of the second surface F2, and the first length d1 may be less than the third length d3.

The fourth length d4 may be less than the second length d2. Furthermore, the fourth length d4 may be less than a height of the protrusion S including the first portion A1 and the second portion A2.

The acute angle θ1 between the second surface F2 and the third surface F3 may be formed to be greater than 45°. A height h of the second portion A2, which is a distance between the first surface F1 and the second surface F2, may be in a range of 0.5 μm to 5.5 μm, but embodiments are not limited thereto.

FIG. 9B shows changes in an amount of extracted light in accordance with a ratio of the first length/the second length of the electroluminescent display device 200 (see FIG. 6) according to the second example embodiment of the present disclosure. Description will be given with reference to the graph in FIG. 9B and the table in FIG. 9C.

The horizontal axis indicates a ratio of the first length d1 to the second length d2, and the vertical axis indicates an amount of light output to the outside, e.g., an amount of extracted light, in a percentage (%).

For example, with regard to an amount of extracted light (%) in accordance with a change in the first length d1 when the height h of the second portion A2 of the protrusion S is 2.5 μm, the angle θ1 between the third surface F3 and the second surface F2 is 78.7°, and the second length d2 is 1.5 μm, it can be seen that the amount of extracted light (%) significantly increases when the first length d1 is in a range of 2 μm to 4 μm. An aspect ratio A/R refers to a value obtained by dividing a height h by a radius of the first surface F1 (where the radius of the first surface F1 refers to the first length d1/2).

As described above, it can be seen that the amount of light extracted to the outside from among light output from the emitting layer 242 (see FIG. 8) significantly increases when the ratio of the first length d1 to the second length d2 is in a range of 1.33 to 2.67.

Therefore, light extraction efficiency may be further improved by setting the ratio of the first length d1 to the second length d2 of the electroluminescent display device 200 (see FIG. 6) according to the second example embodiment of the present disclosure to be in a range of 1.1 to 2.9, and furthermore, to be in a range 1.33 to 2.67.

Figure 10:
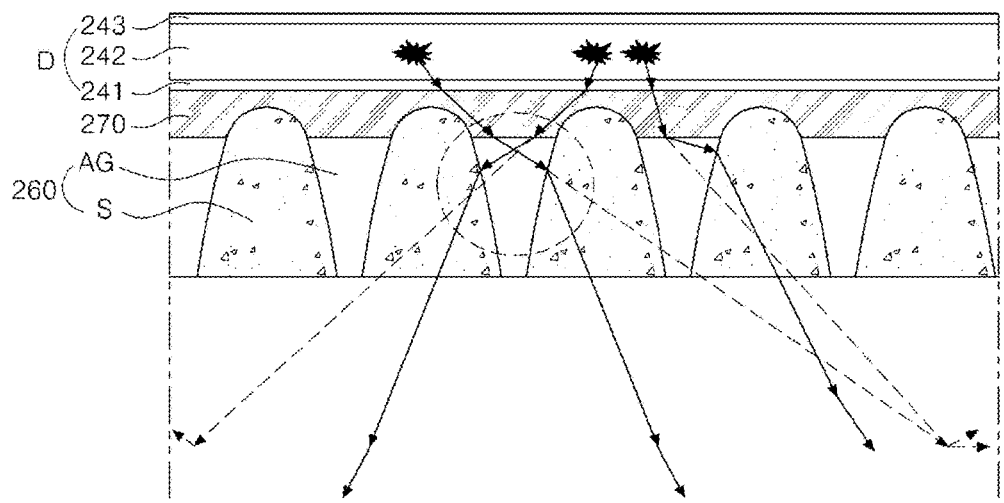
FIG. 10 is a view illustrating an optical path of the electroluminescent display device according to the second example embodiment of the present disclosure.

FIG. 10 is a view illustrating an optical path of the electroluminescent display device according to the second example embodiment of the present disclosure.

As illustrated in FIG. 10, an overcoat layer 260 of an electroluminescent display device 200 (see FIG. 6) according to the second example embodiment of the present disclosure includes a plurality of protrusions S and air gaps AG in an emissive area EA (see FIG. 7), wherein a high-viscosity material layer 270 is disposed on the overcoat layer 260, and a smooth light emitting diode D is disposed on the high-viscosity material layer 270.

Refractive indices of the high-viscosity material layer 270 and the plurality of protrusions S may be greater than a refractive index of the air gaps AG. For example, the refractive indices of the high-viscosity material layer 270 and the plurality of protrusions S may be in a range of 1.4 to 1.6 while the refractive index of the air gaps AG is 1, but embodiments are not limited thereto.

Refractive indices of an emitting layer 242 and a first electrode 241 may be greater than the refractive indices of the high-viscosity material layer 270 and the plurality of protrusions S. For example, the refractive indices of the emitting layer 242 and the first electrode 241 may be in a range of 1.8 to 2.0, but embodiments are not limited thereto.

Accordingly, light output from the emitting layer 242 passes through the first electrode 241, the high-viscosity material layer 270 having a relatively low refractive index, the air gaps AG having a relatively low refractive index, and the plurality of protrusions S having a relatively high refractive index, thereby being output to the outside instead of being trapped inside the emitting layer 242.

That is, because the air gaps AG disposed between the plurality of protrusions S serve to guide light, which is trapped without being output to the outside, and change an optical path of the light to allow the light to be extracted to the outside, light extraction efficiency may be improved.

As described above, the second example embodiment of the present disclosure may allow light output from the emitting layer 242 to be evenly and efficiently extracted to the outside using the high-viscosity material layer 270 and the overcoat layer 260 including the plurality of protrusions S and the air gaps AG.

Accordingly, an occurrence of black areas BA (see FIG. 5) from which light is not output to the outside may be prevented while light extraction efficiency is improved.

Third Example Embodiment

Hereinafter, detailed description of configurations identical or similar to those of the second example embodiment may be omitted.

Figure 11:
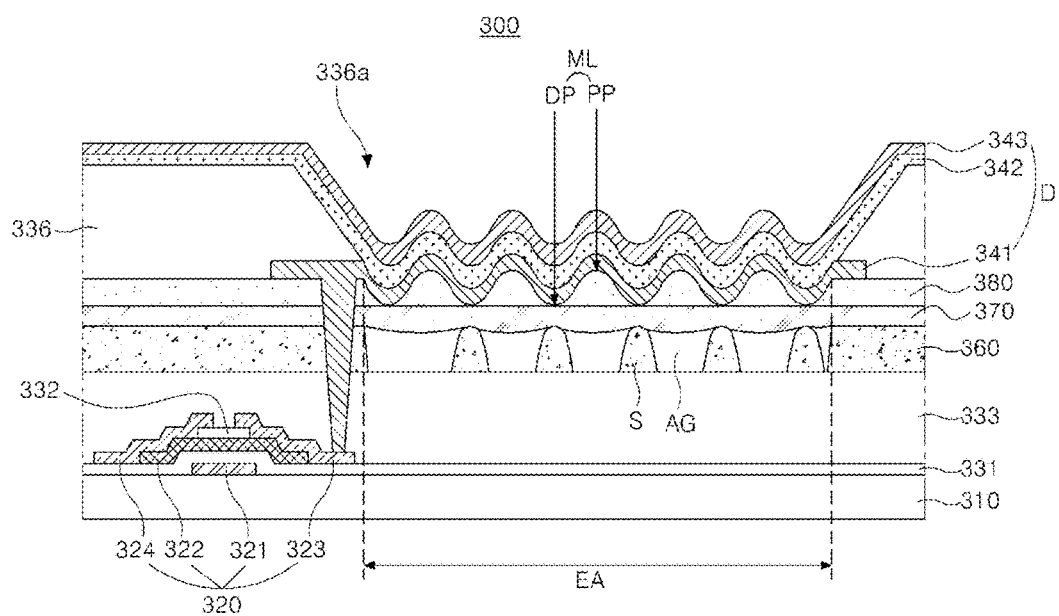
FIG. 11 is a cross-sectional view illustrating an electroluminescent display device according to the third example embodiment of the present disclosure.
Figure 12:
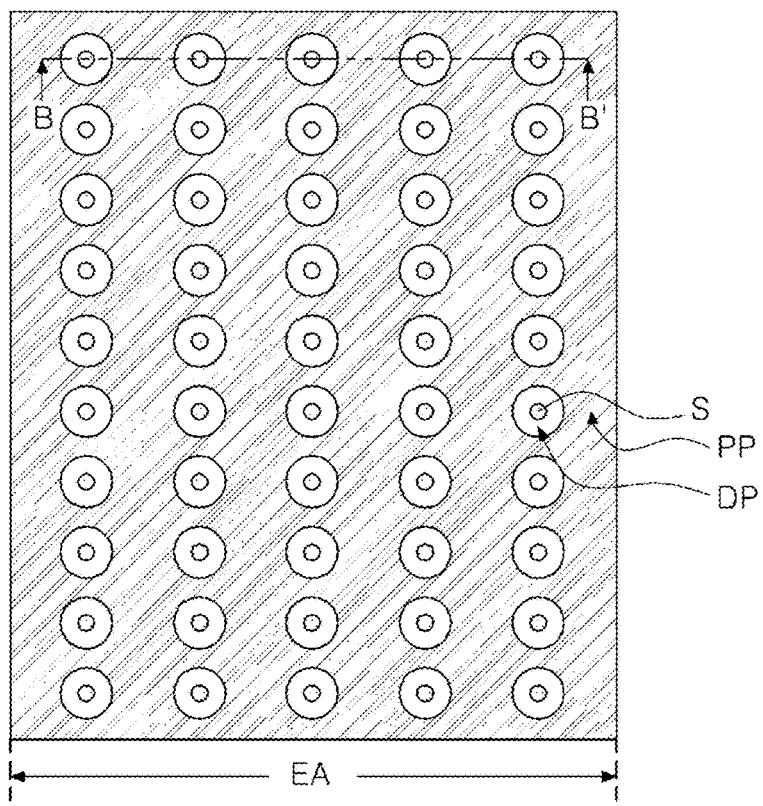
FIG. 12 is a plan view illustrating an emissive area of the electroluminescent display device according to the third example embodiment of the present disclosure.
Figure 13:
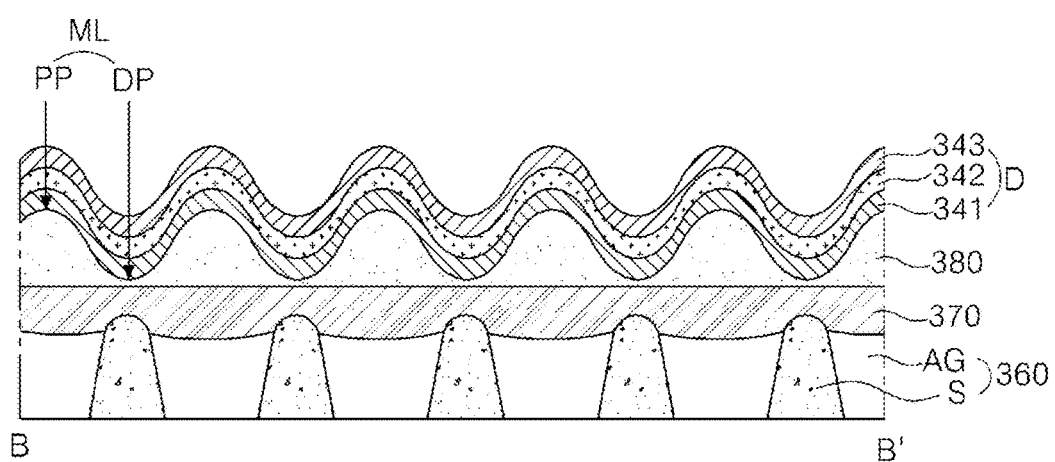
FIG. 13 is a cross-sectional view taken along line B-B' of FIG. 12.
Figure 14:
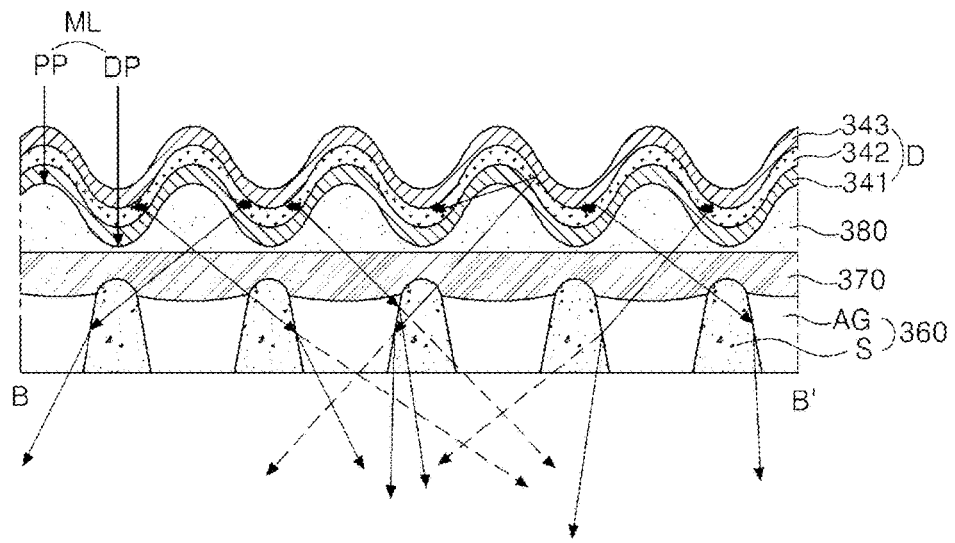
FIG. 14 is a view illustrating an optical path of the electroluminescent display device according to the third example embodiment of the present disclosure.

FIG. 11 a cross-sectional view illustrating an electroluminescent display device according to the third example embodiment of the present disclosure, FIG. 12 is a plan view illustrating an emissive area of the electroluminescent display device according to the third example embodiment of the present disclosure, FIG. 13 is a cross-sectional view taken along line B-B' of FIG. 12, and FIG. 14 is a view illustrating an optical path of the electroluminescent display device according to the third example embodiment of the present disclosure.

As illustrated in FIG. 11, an electroluminescent display device 300 according to the third example embodiment of the present disclosure includes a substrate 310, a thin film transistor 320, a first overcoat layer 360, a second overcoat layer 380, and a light emitting diode D electrically connected to the thin film transistor 320.

In an example, a gate electrode 321 of the thin film transistor 320 and a gate insulating film 331 may be disposed on the substrate 310.

An active layer 322, which overlaps the gate electrode 321, may be disposed on the gate insulating film 331. An etch stopper 332 for protecting a channel area of the active layer 322 may be disposed on the active layer 322. A source electrode 323 and a drain electrode 324, which come into contact with the active layer 322, may be disposed on the active layer 322.

A protective layer 333 may be disposed on the drain electrode 324 and the source electrode 323, and a color filter pattern (not shown) may be disposed on the protective layer 333.

The first overcoat layer 360 may be disposed on the protective layer 333. The first overcoat layer 360 of the electroluminescent display device 300 according to the third example embodiment of the present disclosure may include, in an emissive area EA, a plurality of protrusions S, each of which are disposed in a form of an island, and air gaps AG.

That is, in the emissive area EA, portions of the first overcoat layer 360 except for the plurality of protrusions S may be etched through a process such as photolithography, wet etching, and dry etching. Accordingly, in the emissive area EA, the plurality of protrusions S, each of which are disposed in the form of an island, may be formed in the first overcoat layer 360.

In an area in which the plurality of protrusions S and air gaps AG are not disposed, the overcoat layer 360 serves as a smoothing layer.

A high-viscosity material layer 370 may be disposed on the first overcoat layer 360. In this case, the air gaps AG may be formed between the plurality of protrusions S of the first overcoat layer 360 due to the high-viscosity material layer 370 being disposed on the plurality of protrusions S.

The top of the plurality of protrusions S may be covered by the high-viscosity material layer 370, and the high-viscosity material layer 370 may have a protruding shape in a direction in which the substrate 310 is disposed, for areas in which the air gaps AG are formed. However, embodiments are not limited thereto, and the high-viscosity material layer 370 may also have a smooth shape.

Refractive indices of the high-viscosity material layer 370 and the plurality of protrusions S may be greater than a refractive index of the air gaps AG. For example, the refractive indices of the high-viscosity material layer 370 and the plurality of protrusions S may be in a range of 1.4 to 1.6, while the refractive index of the air gaps AG is 1.

Refractive indices of an emitting layer 342 and a first electrode 341 may be greater than the refractive indices of the high-viscosity material layer 370 and the plurality of protrusions S. For example, the refractive indices of the emitting layer 342 and the first electrode 341 may be in a range of 1.8 to 2.0.

Because the shapes of the plurality of protrusions S and air gaps AG formed in the first overcoat layer 360 are identical or substantially similar to those in the second example embodiment, detailed description thereof will be omitted.

In an example, to further improve the light extraction efficiency in the electroluminescent display device 300 according to the third example embodiment of the present disclosure, the electroluminescent display device 300 may include the second overcoat layer 380 having a micro lens ML disposed on the high-viscosity material layer 370 corresponding to the emissive area EA.

The micro lens ML may include a plurality of recessed portions DP and a plurality of protruding portions PP, but embodiments are not limited thereto. The micro lens ML may have various other forms.

In an area in which the plurality of recessed portions DP and the plurality of protruding portions PP are not disposed, the second overcoat layer 380 serves as a smoothing layer.

Each of the plurality of recessed portions DP may have various shapes in plan view such as a hexagonal shape, a semicircular shape, a semielliptical shape, and a quadrilateral shape.

A light emitting diode D including the first electrode 341, the emitting layer 342, and a second electrode 343 may be disposed on the second overcoat layer 380.

To block the spread of outgassing from the second overcoat layer 380 to the light emitting diode D, a second protective layer (not shown) which has an insulating property may be disposed between the second overcoat layer 380 and the first electrode 341.

That is, the second protective layer, which follows the morphology of the plurality of recessed portions DP and the plurality of protruding portions PP of the second overcoat layer 380 exactly, may be disposed between the second overcoat layer 380 and the first electrode 341.

The first electrode 341 may be disposed on the second overcoat layer 380. In this case, the first electrode 341 may be an anode or cathode for supplying one of electrons or holes to the emitting layer 342.

A case in which the first electrode 341 of the electroluminescent display device 300 according to the third example embodiment of the present disclosure is an anode will be described as an example.

The first electrode 341 may be formed of a conductive material whose work function value is relatively large. For example, the first electrode 341 may be formed of a transparent conductive material such as ITO and IZO.

The first electrode 341 may be connected to the source electrode 323 of the thin film transistor 320 through a contact hole formed in the first overcoat layer 360, the high-viscosity material layer 370, and the second overcoat layer 380 and may be separately formed for each pixel area.

The electroluminescent display device 300 according to the third example embodiment of the present disclosure has been described using an example which assumes that the thin film transistor 320 is an N-type thin film transistor in which the first electrode 341 is connected to the source electrode 323, but embodiments are not limited thereto. When the thin film transistor 320 is a P-type thin film transistor, the first electrode 341 may also be connected to the drain electrode 324.

The first electrode 341 may also be electrically connected to the emitting layer 342 by coming into contact with the emitting layer 342 with a conductive material therebetween. The first electrode 341 is disposed in a shape which follows the morphology of a surface of the second overcoat layer 380 in the emissive area EA. That is, the first electrode 341 may be disposed in a form which follows the morphology of the plurality of recessed portions DP and the plurality of protruding portions PP of the second overcoat layer 380 exactly.

A bank layer 336 may be disposed on the second overcoat layer 380 and the first electrode 341. The bank layer 336 may include an opening 336a configured to expose the first electrode 341. The bank layer 336 may be disposed between adjacent pixel (or subpixel) areas and serve to differentiate the adjacent pixel (or subpixel) areas.

In this case, the plurality of recessed portions DP and the plurality of protruding portions PP of the second overcoat layer 380 may be disposed in the opening 336a of the bank layer 336.

The emitting layer 342 may be disposed on the exposed first electrode 341. The emitting layer 342 may have a tandem white structure in which a plurality of emitting layers are stacked to emit white light.

For example, the emitting layer 342 may include a first emitting layer configured to emit blue light and a second emitting layer disposed on the first emitting layer and configured to emit light having a color which turns white when mixed with blue.

The second emitting layer may be an emitting layer configured to emit yellow-green light.

The emitting layer 342 may only include emitting layers that emit one of blue light, red light, and green light. In this case, the electroluminescent display device 300 may not include a color filter pattern. In this case, an emitting material of the emitting layer 342 may be an organic emitting material, or an inorganic emitting material such as a quantum dot.

Also, the emitting layer 342 may have a shape which follows the morphology of the second overcoat layer 380.

The second electrode 343 for supplying one of electrons or holes to the emitting layer 342 may be disposed on the emitting layer 342. In this case, the second electrode 343 may be an anode or a cathode.

A case in which the second electrode 343 of the electroluminescent display device 300 according to the third example embodiment of the present disclosure is a cathode will be described as an example.

The second electrode 343 may be formed of a conductive material, whose work function value is relatively small, and which is located on a front surface of a display area. For example, the second electrode 343 may be formed of Al, Mg, Ag, or an alloy thereof, but embodiments are not limited thereto.

The second electrode 343 may have a shape which follows the morphology of the second overcoat layer 380 in the emissive area EA.

The first electrode 341, the emitting layer 342, and the second electrode 343 form a light emitting diode D, and the light emitting diode D follows the morphology of the plurality of recessed portions DP and the plurality of protruding portions PP of the second overcoat layer 380.

The shape of the light emitting diode D may be realized using the plurality of recessed portions DP and the plurality of protruding portions PP of the second overcoat layer 380.

As illustrated in FIG. 12, the first overcoat layer 360 of the electroluminescent display device 300 according to the third example embodiment of the present disclosure may include a plurality of protrusions S, each of which are disposed in the form of an island, in the emissive area EA.

Each of the plurality of protrusions S may have a circular shape in plan view, but embodiments are not limited thereto. Each of the plurality of protrusions S may have various other shapes in plan view, such as a semicircular shape, a semielliptical shape, and a polygonal shape.

In the emissive area EA, the air gaps AG may be formed in areas excluding those in which the plurality of protrusions S are formed.

The second overcoat layer 380 may include a plurality of protruding portions PP and recessed portions DP in the emissive area EA.

Although the plurality of recessed portions DP of the second overcoat layer 380 and the protrusions S of the first overcoat layer 360 are illustrated in FIG. 12 as being disposed at positions overlapping each other, this is merely an example, and embodiments are not limited thereto. The plurality of protruding portions PP of the second overcoat layer 380 and the protrusions S of the first overcoat layer 360 may be disposed at positions overlapping each other, or the protrusions S of the first overcoat layer 360 may be disposed between the protruding portions PP and the recessed portions DP of the second overcoat layer 380.

As illustrated in FIG. 13, the top of each of the plurality of protrusions S of the electroluminescent display device 300 according to the third example embodiment of the present disclosure may be disposed inside the high-viscosity material layer 370.

That is, when the high-viscosity material layer 370 is disposed on the plurality of protrusions S, the high-viscosity material layer 370 may cover the top of the plurality of protrusions S.

A bottom surface of the high-viscosity material layer 370 may have a protruding shape toward the substrate 310, but embodiments are not limited thereto. The bottom surface of the high-viscosity material layer 370 may also have a smooth shape.

In a case in which the bottom surface of the high-viscosity material layer 370 is formed with a protruding shape, light output from the emitting layer 342 may be further diffused.

By the high-viscosity material layer 370 being disposed on the plurality of protrusions S as described above, the air gaps AG having a relatively low refractive index may be formed without a separate process.

The bottom surface of the high-viscosity material layer 370 may have various shapes by adjusting the viscosity of the high-viscosity material layer 370, a distance between the plurality of protrusions S, and the like.

The second overcoat layer 380 formed of the same material as the first overcoat layer 360 may be disposed on the high-viscosity material layer 370.

As described above, the second overcoat layer 380 may include the plurality of protruding portions PP and recessed portions DP in the emissive area EA, and the light emitting diode D, which follows the morphology of the plurality of recessed portions DP and the plurality of protruding portions PP of the second overcoat layer 380, may be disposed on the second overcoat layer 380.

As illustrated in FIG. 14, in the emissive area EA of the electroluminescent display device 300 according to the third example embodiment of the present disclosure, the first overcoat layer 360 including the plurality of protrusions S and air gaps AG and the second overcoat layer 380 including the plurality of protruding portions PP and recessed portions DP are disposed with the high-viscosity material layer 370 sandwiched therebetween. In this way, light, which is trapped in the emitting layer 342 due to being totally reflected inside the emitting layer 342, is allowed to be extracted to the outside through the protruding portions PP of the second overcoat layer 380 so that light extraction efficiency is improved. Also, an optical path of light output from the second overcoat layer 380 is changed using the protrusions S and air gaps AG of the first overcoat layer 360, whose refractive indices differ, to evenly output the light to the outside so that an occurrence of black areas is effectively reduced and/or prevented while light extraction efficiency is improved.

Figure 15:
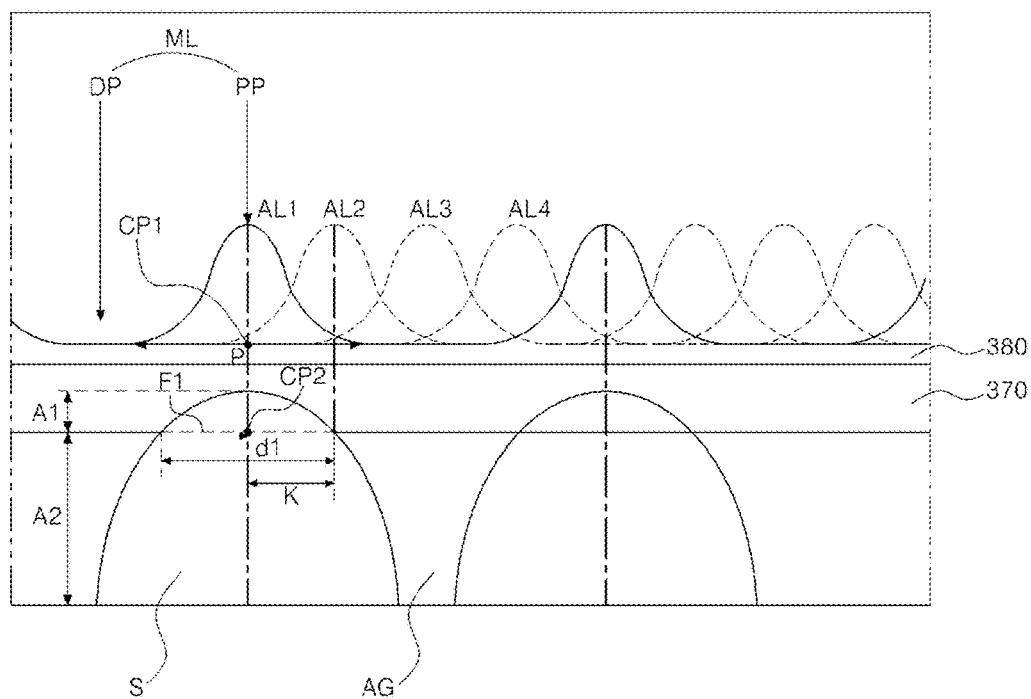
FIG. 15 is a view illustrating a change in a position of a protruding portion disposed on a protrusion of the electroluminescent display device according to the third example embodiment of the present disclosure.

FIG. 15 is a view illustrating a change in a position of a protruding portion disposed on a protrusion of the electroluminescent display device according to the third example embodiment of the present disclosure, and FIGS. 16A to 16D are views illustrating an optical path in accordance with a change in a position of a protruding portion disposed on a protrusion of the electroluminescent display device according to the third example embodiment of the present disclosure.

A plurality of protrusions S formed in the first overcoat layer 360 and a plurality of protruding portions PP formed in the second overcoat layer 380 are illustrated in FIG. 15.

A first surface F1, which is a boundary surface between a first portion A1 and a second portion A2 of each protrusion S of the first overcoat layer 360, and first to fourth alignments AL1, AL2, AL3, and AL4 of the plurality of protruding portions PP formed in the second overcoat layer 380 are illustrated in FIG. 15.

The first alignment AL1 refers to where a central point CP2 of a first length d1 of the first surface F1 of each protrusion S formed in the first overcoat layer 360 corresponds to a central point CP1 of a pitch P of each protruding portion PP formed in the second overcoat layer 380.

The second alignment AL2 refers to a case in which the central point CP1 of the pitch P of each protruding portion PP has shifted from the first alignment AL1 by a width K, which corresponds to a half of the first length d1 of the first surface F1 of each protrusion S formed in the first overcoat layer 360.

The third alignment AL3 refers to a case in which the central point CP1 of the pitch P of each protruding portion PP has shifted from the second alignment AL2 by the width K, which corresponds to the half of the first length d1.

The fourth alignment AL4 refers to a case in which the central point CP1 of the pitch P of each protruding portion PP has shifted from the third alignment AL3 by the width K, which corresponds to the half of the first length d1.

Optical paths in accordance with the first to fourth alignments AL1, AL2, AL3, and AL4 are illustrated in FIGS. 16A to 16D. That is, FIGS. 16A to 16D illustrate paths in which light output from the emitting layer 342 (see FIG. 14) is output to the outside through the plurality of protruding portions PP of the second overcoat layer 380 and the plurality of protrusions S of the first overcoat layer 360, in cases in which the protrusions S formed in the first overcoat layer 360 and the protruding portions PP formed in the second overcoat layer 380 are disposed at the first to fourth alignments AL1, AL2, AL3, and AL4.

Figure 16A:
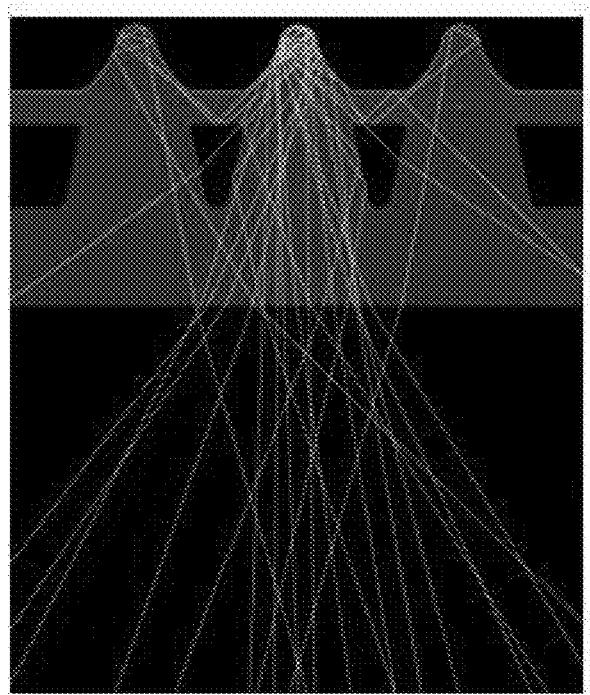
FIGS. 16A to 16D are views illustrating an optical path in accordance with a change in a position of a protruding portion disposed on a protrusion of the electroluminescent display device according to the third example embodiment of the present disclosure.
Figure 16B:
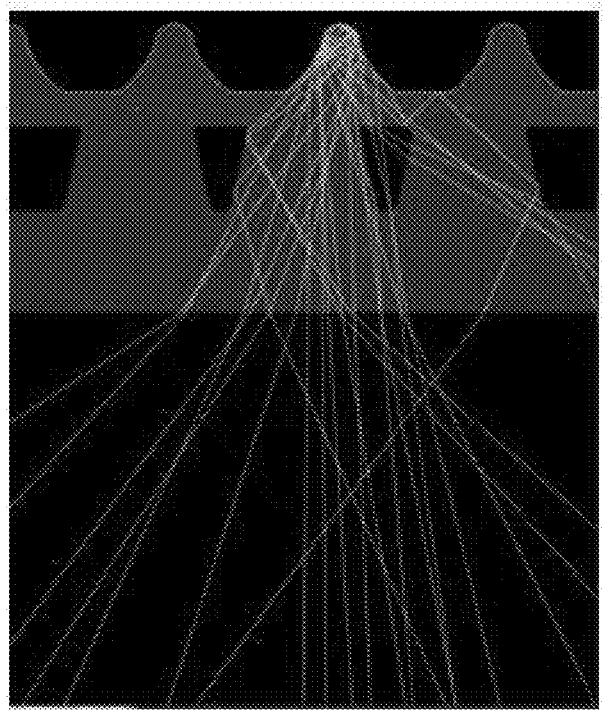
Figure 16C:
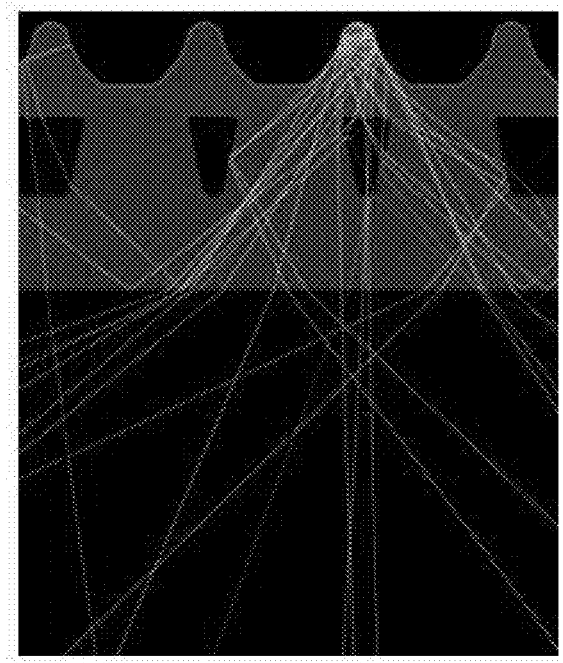
Figure 16D:
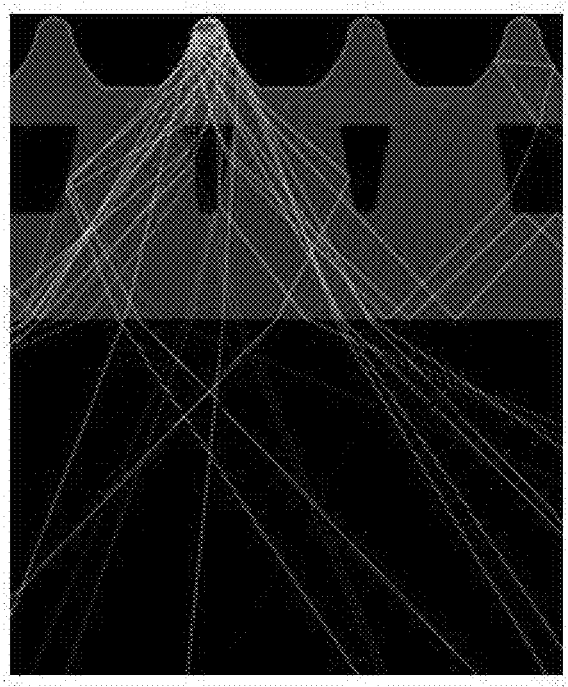

FIG. 16A illustrates an optical path in a case in which the plurality of protrusions S formed in the first overcoat layer 360 and the plurality of protruding portions PP formed in the second overcoat layer 380 are disposed at the first alignment AL1. FIG. 16B illustrates an optical path in a case in which the plurality of protrusions S formed in the first overcoat layer 360 and the plurality of protruding portions PP formed in the second overcoat layer 380 are disposed at the second alignment AL2. FIG. 16C illustrates an optical path in a case in which the plurality of protrusions S formed in the first overcoat layer 360 and the plurality of protruding portions PP formed in the second overcoat layer 380 are disposed at the third alignment AL3. FIG. 16D illustrates an optical path in a case in which the plurality of protrusions S formed in the first overcoat layer 360 and the plurality of protruding portions PP formed in the second overcoat layer 380 are disposed at the fourth alignment AL4.

It can be seen that an amount of light totally reflected inside the electroluminescent display device 300 (see FIG. 11) increases, and thus, an amount of light extracted to the outside decreases progressively from the first alignment AL1 to the fourth alignment AL4.

That is, it can be seen that light extraction efficiency decreases progressively as an overlapping portion between the protrusions S of the first overcoat layer 360 and the protruding portions PP of the second overcoat layer 380 of the electroluminescent display device 300 (see FIG. 11) according to the third example embodiment of the present disclosure is reduced.

Therefore, light extraction efficiency may be further improved when the protrusions S of the first overcoat layer 360 and the protruding portions PP of the second overcoat layer 380 are formed to overlap each other. In an example, light extraction efficiency may be maximally improved when the central point CP2 of each protrusion S of the first overcoat layer 360 and the central point CP1 of each protruding portion PP of the second overcoat layer 380 are formed to correspond to each other.

As described above, in the emissive area EA of the electroluminescent display device 300 according to the third example embodiment of the present disclosure, the first overcoat layer 360 including the plurality of protrusions S and air gaps AG and the second overcoat layer 380 including the plurality of protruding portions PP and recessed portions DP are disposed with the high-viscosity material layer 370 sandwiched therebetween. In this way, light, which is trapped in the emitting layer 342 due to being totally reflected inside the emitting layer 342, is allowed to be extracted to the outside through the protruding portions PP of the second overcoat layer 380 so that light extraction efficiency is improved. Also, an optical path of light output from the second overcoat layer 380 is changed using the protrusions S and air gaps AG of the first overcoat layer 360, whose refractive indices differ, to evenly output the light to the outside so that an occurrence of black areas is effectively prevented while light extraction efficiency is improved.

Further, the protrusions S of the first overcoat layer 360 and the protruding portions PP of the second overcoat layer 380 are formed to overlap each other so that light extraction efficiency is further improved.

In embodiments of the present disclosure, air gaps are formed between an emitting layer and a substrate by using protrusions of an overcoat layer and a high-viscosity material layer, so that light trapped in the substrate is allowed to be output to the outside. In this way, light extraction efficiency can be effectively improved.

It will be apparent to those skilled in the art that various modifications and variations can be made in the embodiments of the disclosure without departing from the spirit or scope of the disclosure. Thus, it is intended that the modifications and variations cover this disclosure provided they come within the scope of the appended claims and their equivalents.

What is claimed is:

1. An electroluminescent display device, comprising:
   a substrate including an emissive area and a non-emissive area;
   a plurality of protrusions over the substrate and in the emissive area, each of the plurality of protrusions spaced apart from each other with an air gap therebetween;
   a high-viscosity material layer on the plurality of protrusions and the air gaps;
   a first electrode on the high-viscosity material layer;
   an emitting layer on the first electrode; and
   a second electrode on the emitting layer,
   wherein each of the plurality of protrusions includes a first portion inside the high-viscosity material layer and a second portion in contact with the air gaps.

2. The electroluminescent display device of claim 1, further comprising:
   an overcoat layer between the high-viscosity material layer and the first electrode and including a plurality of protruding portions and recessed portions in the emissive area.

3. The electroluminescent display device of claim 2, wherein the protruding portions overlap the protrusions.

4. The electroluminescent display device of claim 2, wherein the first electrode, the emitting layer, and the second electrode are disposed along a shape of a top surface of the overcoat layer and include the morphology of the overcoat layer including the plurality of protruding portions and recessed portions.

5. The electroluminescent display device of claim 2, wherein a central point of each protrusion and a central point of each protruding portion of the overcoat layer correspond to each other.

6. The electroluminescent display device of claim 1, wherein:
   each of the plurality of protrusions further includes a first surface, which is a boundary surface between the first portion and the second portion; and
   a distance between neighboring first surfaces is less than a length of the first surface.

7. The electroluminescent display device of claim 6, wherein a ratio of the length of the first surface to the distance between neighboring first surfaces is in a range of about 1.1 to 2.9.

8. The electroluminescent display device of claim 6, wherein the second portion includes a second surface disposed between the first surface and the substrate and a third surface connecting the first surface and the second surface, and the third surface and the second surface form an acute angle therebetween.

9. The electroluminescent display device of claim 8, wherein the acute angle is equal to or greater than 45°.

10. The electroluminescent display device of claim 1, wherein the high-viscosity material layer has a protruding shape toward the substrate.

11. The electroluminescent display device of claim 1, wherein refractive indices of the high-viscosity material layer and the plurality of protrusions are smaller than a refractive index of the first electrode.

12. The electroluminescent display device of claim 1, wherein the high-viscosity material layer has a first thickness in correspondence to the protrusions and a second thickness, which is greater than the first thickness, between adjacent protrusions.

13. The electroluminescent display device of claim 1, wherein refractive indices of the high-viscosity material layer and the plurality of protrusions is higher than a refractive index of the air gap.

14. The electroluminescent display device of claim 1, wherein the protrusions are formed in an island shape, and the air gap surrounds the protrusions.

15. An electroluminescent display device, comprising:
   a substrate including an emissive area and a non-emissive area;
   a plurality of protrusions over the substrate and in the emissive area, each of the plurality of protrusions spaced apart from each other with an air gap therebetween;
   a high-viscosity material layer on the plurality of protrusions and the air gaps;
   a first electrode on the high-viscosity material layer;
   an emitting layer on the first electrode;
   a second electrode on the emitting layer; and
   an overcoat layer between the high-viscosity material layer and the first electrode and including a plurality of protruding portions and recessed portions in the emissive area.

16. The electroluminescent display device of claim 15, wherein the protruding portions overlap the protrusions.

17. The electroluminescent display device of claim 15, wherein the first electrode, the emitting layer, and the second electrode are disposed along a shape of a top surface of the overcoat layer and include the morphology of the overcoat layer including the plurality of protruding portions and recessed portions.

18. The electroluminescent display device of claim 15, wherein a central point of each protrusion and a central point of each protruding portion of the overcoat layer correspond to each other.

19. The electroluminescent display device of claim 15, wherein refractive indices of the high-viscosity material layer and the plurality of protrusions are smaller than a refractive index of the first electrode.

20. The electroluminescent display device of claim 15, wherein the high-viscosity material layer has a first thickness in correspondence to the protrusions and a second thickness, which is greater than the first thickness, between adjacent protrusions.

* * * * *